US010859776B2

(12) United States Patent
Yoo et al.

(10) Patent No.: US 10,859,776 B2
(45) Date of Patent: Dec. 8, 2020

(54) OPTICAL-ELECTRICAL INTERPOSERS

(71) Applicant: The Regents of the University of California, Oakland, CA (US)

(72) Inventors: Sung-Joo Ben Yoo, Davis, CA (US); Robert S. Patti, Warrenville, IL (US)

(73) Assignee: The Regents of the University of California, Oakland, CA (US)

( * ) Notice: Subject to any disclaimer, the term of this patent is extended or adjusted under 35 U.S.C. 154(b) by 32 days.

(21) Appl. No.: 16/375,667

(22) Filed: Apr. 4, 2019

(65) Prior Publication Data
US 2019/0310433 A1 Oct. 10, 2019

Related U.S. Application Data

(60) Provisional application No. 62/653,802, filed on Apr. 6, 2018.

(51) Int. Cl.
*G02B 6/42* (2006.01)
*H01L 25/00* (2006.01)
*H01L 23/00* (2006.01)
*H01L 23/13* (2006.01)
*H01L 23/544* (2006.01)
(Continued)

(52) U.S. Cl.
CPC ........... *G02B 6/428* (2013.01); *G02B 6/4232* (2013.01); *G02B 6/4238* (2013.01); *G02B 6/4245* (2013.01); *H01L 21/4853* (2013.01); *H01L 23/13* (2013.01); *H01L 23/5384* (2013.01); *H01L 23/5385* (2013.01); *H01L 23/544* (2013.01); *H01L 24/16* (2013.01); *H01L 24/81* (2013.01); *H01L 25/18* (2013.01); *H01L 25/50* (2013.01); *H01L 2223/54426* (2013.01); *H01L 2224/16227* (2013.01); *H01L 2224/81138* (2013.01); *H01L 2224/81815* (2013.01);
(Continued)

(58) Field of Classification Search
CPC ..... H01L 21/4854; H01L 24/16; H01L 24/13; H01L 24/17; H01L 24/81; H01L 23/13; H01L 23/544; H01L 23/5384; H01L 23/5385; H01L 25/18; H01L 25/50; G02B 6/428; G02B 6/4232; G02B 6/4238; G02B 6/4245
See application file for complete search history.

(56) References Cited

U.S. PATENT DOCUMENTS 7,999,383 B2 * 8/2011 Hollis ................. H01L 23/5227
257/758
8,709,880 B2 * 4/2014 Or-Bach .............. H03K 17/687
257/E21.575
(Continued)

*Primary Examiner* — Thomas A Hollweg
*Assistant Examiner* — Mary A El-Shammaa
(74) *Attorney, Agent, or Firm* — Park, Vaughan, Fleming & Dowler LLP

(57) ABSTRACT

The disclosed embodiments provide a method for integrating an optical interposer with one or more electronic dies and an optical-electronic (OE) printed circuit board (PCB). This method involves first applying surface-connection elements to a surface of the optical interposer, and then bonding the one or more electrical dies to the optical interposer using the surface-connection elements. Next, the method integrates the OE-PCB onto the surface of the optical interposer, wherein the integration causes the surface-connection elements to provide electrical connections between the optical interposer and the OE-PCB.

27 Claims, 10 Drawing Sheets

(51) Int. Cl.
*H01L 25/18* (2006.01)
*H01L 23/538* (2006.01)
*H01L 21/48* (2006.01)

(52) U.S. Cl.
CPC ............... *H01L 2224/81896* (2013.01); *H01L 2924/1432* (2013.01); *H01L 2924/1434* (2013.01)

(56) References Cited

U.S. PATENT DOCUMENTS

| | | | |
|---|---|---|---|
| 2003/0007750 A1 | 1/2003 | Kryzak | |
| 2008/0284037 A1* | 11/2008 | Andry | H01L 21/6835 257/774 |
| 2009/0267171 A1* | 10/2009 | Yean | H01L 23/3107 257/434 |
| 2013/0267273 A1* | 10/2013 | Rudmann | H01L 25/50 455/556.1 |
| 2014/0029639 A1* | 1/2014 | Zarbock | G02B 6/4274 372/50.1 |
| 2016/0071818 A1* | 3/2016 | Wang | H01L 24/06 257/774 |
| 2017/0237516 A1* | 8/2017 | Welch | H04J 14/02 398/79 |
| 2018/0267265 A1* | 9/2018 | Zhang | G02B 6/3849 |
| 2018/0292607 A1* | 10/2018 | Dong | G02B 6/126 |
| 2019/0302379 A1* | 10/2019 | Raghunathan | G02B 6/4212 |

* cited by examiner

OPTICAL-ELECTRICAL INTERPOSERS

CROSS-REFERENCE TO RELATED APPLICATION

This application claims priority under 35 U.S.C. § 119(e) to U.S. Provisional Application Ser. No. 62/653,802, entitled "Optical-Electrical Interposers," by inventors Sung-Joo Ben Yoo and Robert S. Patti, filed on 6 Apr. 2018, the contents of which are hereby incorporated herein by reference.

BACKGROUND

Field

The disclosed embodiments generally relate to the design of electro-optical computing systems. More specifically, the disclosed embodiments relate to a technique for fabricating a computing system by integrating optical interposers with optical-electronic printed circuit boards.

Related Art

The need for high-capacity communications in computer systems has led to the incorporation of photonic technologies into data centers. For example, FIG. 1A illustrates a conventional all-electronic computing system, wherein a processor implemented on an application-specific-integrated circuit (ASIC) 102 is integrated into a ball-grid-array (BGA) package 104, and wherein a memory 106 is integrated into another BGA package 108. These components are connected to electrical input-output (I/O) modules 111-114, which interface with electrical communication links 116. In contrast, FIG. 1B illustrates a current-generation embedded optics system, wherein the same components are connected to optical input-output (I/O) modules 121-124, which interface with optical communication links 126. Note that these optical communication links 126 provide significantly larger communication capacity than the electrical communication links 116.

Unfortunately, in these current-generation embedded-optics systems, the optical solutions are implemented using pluggable devices, which are separate from the I/O electronics. This limits energy efficiency and processing speed, and consequently does not provide significant improvements in the communication chain. To increase energy efficiency further, the distance between the electronics and photonics needs to be less than ~1 mm to avoid impedance effects, such as capacitance and skin-effect-induced high resistance. This can potentially be achieved by using optical interposers to facilitate close integration of electronics and photonics. For example, see the optical-interposer-based system illustrated in FIG. 1C, which is not prior art, wherein embedded photonics in silicon photonic I/O modules 134-135 are intimately integrated with ASIC 102 and memory 106 through an optical interposer 133, which is coupled to silicon photonic links 136 that are connected with optical communication links 126.

However, current optical interposer approaches do not support such close integration between photonics and electronics. (For example, see the optical interposer design guide, which is part of the recently announced Analog Photonics (AP) SUNY Process Design Kit by the American Institute for Manufacturing Integrated Photonics (AIM Photonics) and AP.) Other optical interposer approaches from Europe and Asia take a much more aggressive approach to achieve close integration, but the associated fabrication processes are very complicated.

Hence, what is needed is a new technique for using optical interposers to achieve close integration between photonics and electronics in electro-optical computing systems without the problems of existing optical-interposer-based techniques.

SUMMARY

The disclosed embodiments provide a method for integrating an optical interposer with one or more electronic dies and an optical-electronic (OE) printed circuit board (PCB). This method involves first applying surface-connection elements to a surface of the optical interposer, and then bonding the one or more electrical dies to the optical interposer using the surface-connection elements. Next, the method integrates the OE-PCB onto the surface of the optical interposer, wherein the integration causes the surface-connection elements to provide electrical connections between the optical interposer and the OE-PCB.

In some embodiments, the surface-connection elements can include one or more of the following: C4 solder bumps; microbumps; copper pillars; bond pads; and metal diffusion bonding elements.

In some embodiments, bonding the one or more electrical dies to the optical interposer involves using one or more of the following bonding techniques: flip-chip bonding; hybrid oxide bonding; and hybrid polymer bonding.

In some embodiments, the optical interposer includes one or more recesses to provide room for the one or more electronic dies, wherein during the assembly process, the one or more electronic dies are bonded within the one or more recesses.

In some embodiments, the optical interposer includes one or more alignment grooves to facilitate optical waveguide alignment and physical interconnection, and also surface-connection elements to facilitate self-alignment involving one or more waveguide connections and matching guide keys, as well as surface-connection elements located on the OE-PCB.

In some embodiments, the alignment grooves in the optical interposer and mating OE-PCB finger connections are physically optimized to facilitate lateral alignment when solder reflow tension is applied to the optical interposer.

In some embodiments, light communication energy is transmitted through surface coupling between groove waveguides of the optical interposer and the OE-PCB finger connections.

In some embodiments, mechanical alignment structures in the optical interposer and the OE-PCB are triangular and/or trapezoidal in shape.

In some embodiments, the triangular and/or trapezoidal shapes of the mechanical alignment structures facilitate gross alignment during an initial pick-and-place assembly operation between the optical interposer and the OE-PCB, and solder balls associated with the surface-connection elements pull the optical interposer into submicron alignment through solder reflow tension to finely align an optical connection between the optical interposer and the OE-PCB.

In some embodiments, the optical interposer comprises a silicon-photonic optical interposer.

The disclosed embodiments also relate to the design of a system with an integrated assembly comprising: an optical interposer; one or more electronic dies; and an OE-PCB. This integrated assembly is produced by: applying surface-connection elements to a surface of the optical interposer; bonding the one or more electrical dies to the surface-connection elements; and integrating the OE-PCB onto the surface of the optical interposer, wherein the integration causes the surface-connection elements to provide electrical connections between the optical interposer and the OE-PCB.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Discussion

Figure 1A:
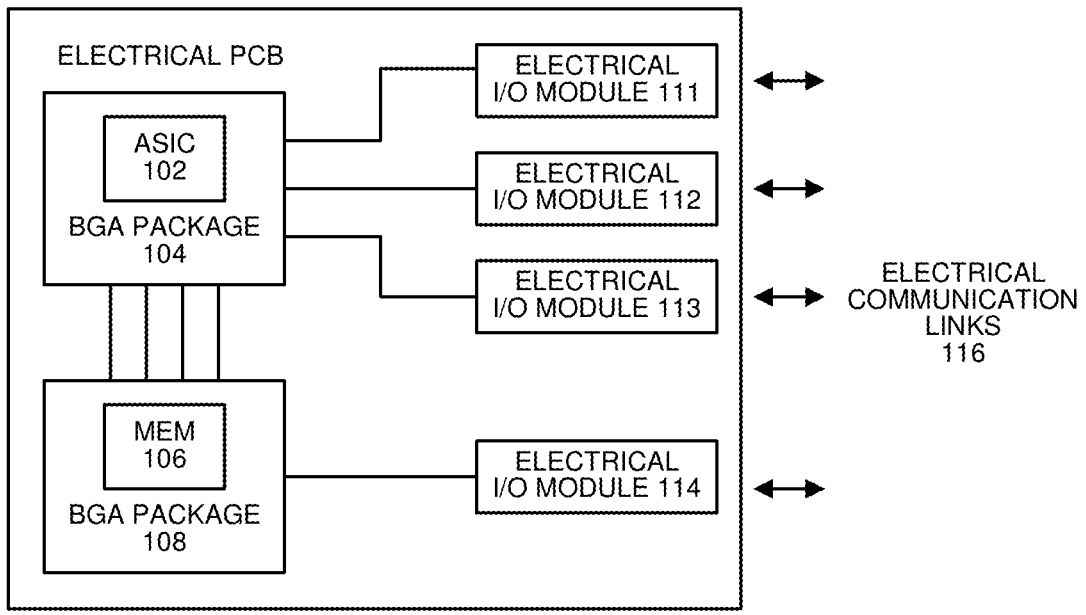
FIG. 1A illustrates a conventional all-electronic system in accordance with disclosed embodiments.
Figure 1B:
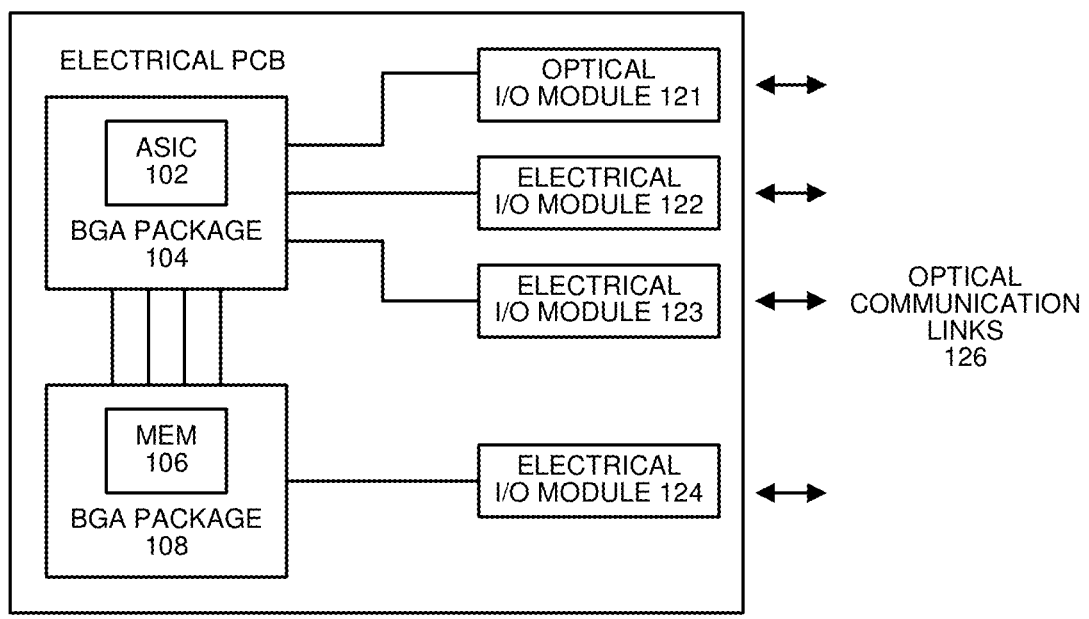
FIG. 1B illustrates a current-generation embedded optics system in accordance with disclosed embodiments.
Figure 1C:
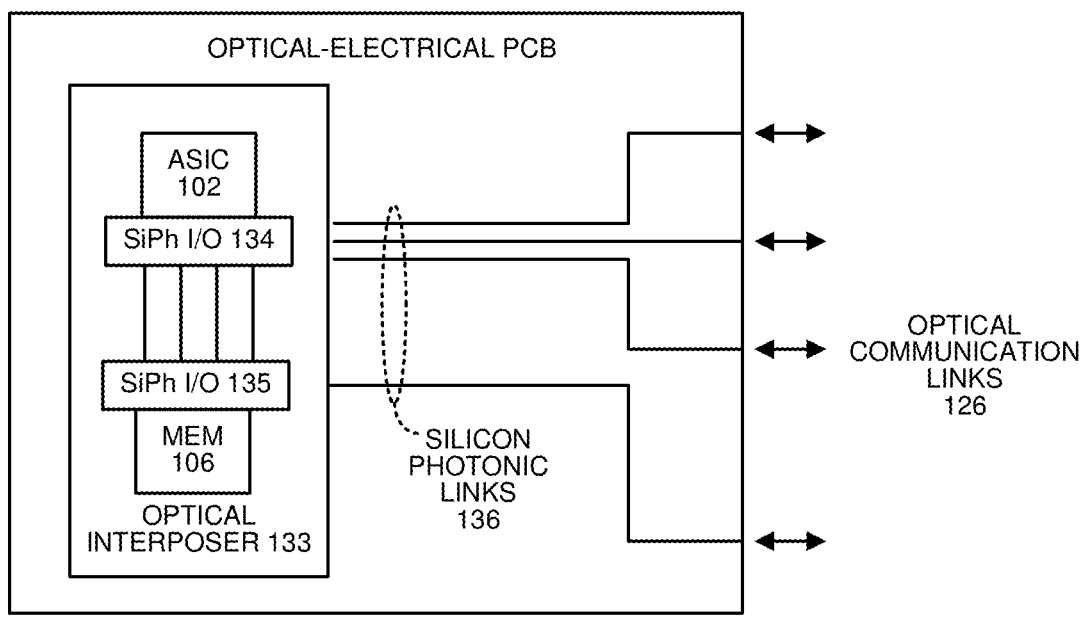
FIG. 1C illustrates an optical-interposer-based system in accordance with disclosed embodiments.

FIG. 1C illustrates an optical-interposer-based system in accordance with disclosed embodiments. As shown in FIG. 1C, we introduce embedded photonics that are intimately integrated with electronics via optical interposers and silicon photonics. Compared to today's embedded optics with standard pluggable optical interfaces to ball grid array (BGA)-packaged ASICs, which typically require more than 25 mm long electrical interconnections, the proposed embedded photonics (with 2.5-dimensional and 3-dimensional integration using silicon-photonic interposers) achieve interconnection lengths below 100 µm between the electronics and the silicon photonics. Note that embedded photonics can significantly affect the energy efficiency and the cost of chip-to-chip, board-to-board, and rack-to-rack data communications. Today's embedded optics systems (as is illustrated in FIG. 1B) provide only limited energy efficiency improvements (35 pJ/b versus 1 pJ/b) because they require serializer/deserializer (SerDes) circuits and clock-and-data-recovery (CDR) circuits. In contrast, the proposed embedded optics solution illustrated in FIG. 1C can provide higher energy efficiency by exploiting optical interposers and closely integrated electronics in three dimensions. By reducing reliance on electrical circuits to perform SerDes, CDR, and equalizing operations, the proposed embedded photonics system can greatly reduce power consumption and operating costs.

Recent trends are clearly favoring modular scalability and software-defined reconfigurability of data centers. To facilitate such scalability, the disclosed embodiments are directed to modular assemblies comprising embedded silicon photonics with ASICs and memories on photonic-electronic interposers that can plug into OE-PCBs, which in turn plug into OE-backplanes.

The disclosed embodiments can exploit photonics embedded with electronics through close integration for a number of interfaces, including: chip-to-chip, board-to-board, and rack-to-rack interconnections. Although monolithic co-integration of CMOS and silicon photonics in the same fabrication runs seems attractive, the yield and required technological compatibility challenges make it impractically expensive. In contrast, optical interposers and OE-PCBs provide practical and effective solutions that facilitate reduced parasitics, low power consumption, dense optical interconnects, and close integration of photonics and electronics, while allowing flexible combinations of heterogeneous technologies with reasonable yield.

Figure 2A:
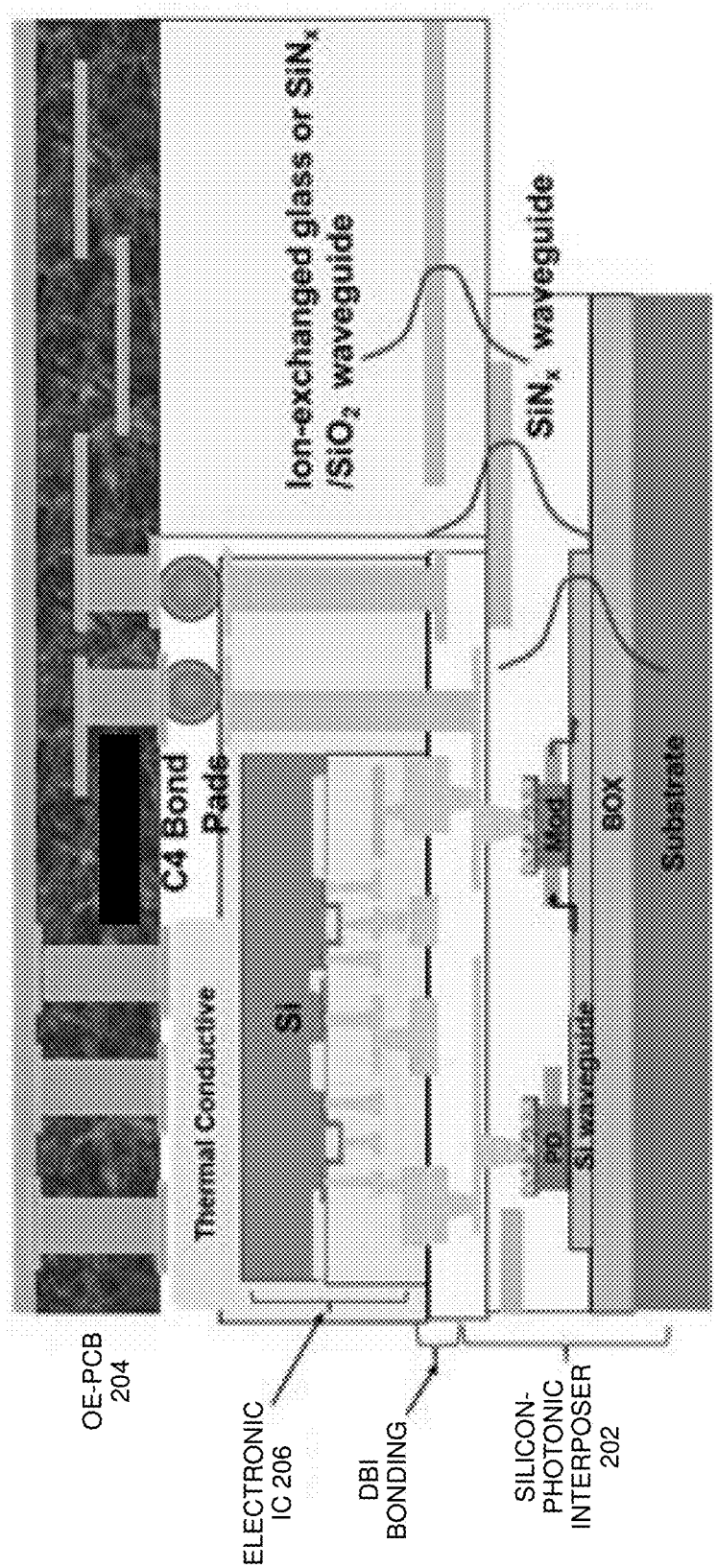
FIG. 2A illustrates an integration of electronic ICs on an optical interposer mounted on an OE-PCB in accordance with disclosed embodiments.

FIG. 2A illustrates details of the proposed optical interposer that provides close integration with electronics with low parasitics (C<3 fF and R<1.1Ω), while offering cost-effective, low loss, and robust integration without requiring costly high-speed through-silicon-vias (TSVs). More specifically, FIG. 2A presents a perspective view of a three-dimensional integration of an electronic IC 206 on an active silicon-photonic interposer 202 with an active optical layer to be mounted on an OE-PCB 204.

In FIG. 2A, silicon-photonic interposer 202 is equipped with grooves and C4 bond pads so that it will self-align and bond to OE-PCB 204 using matching waveguide keys and C4 bond pads. Note that OE-PCBs and OE-backplanes can exploit low-loss optical waveguide layers laminated on conventional electrical PCBs. While $Si_3N_4/SiO_2$ waveguides are illustrated in this example, it is also possible to exploit lamination of ion-exchanged silica waveguide layers.

Figure 2B:
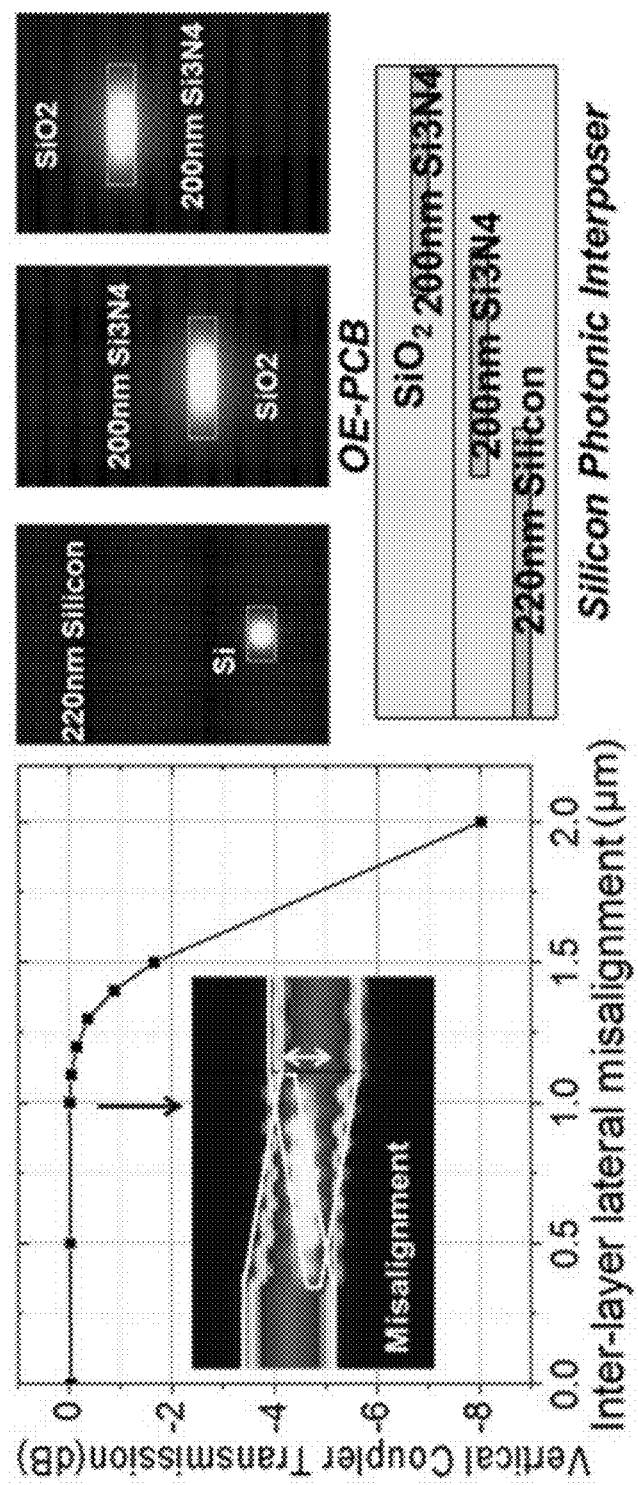
FIG. 2B illustrates optical loss as a function of misalignment for the integration of the optical interposer and the OE-PCB in accordance with disclosed embodiments.

Simulated performance results presented in FIG. 2B show that a less than 0.1 dB optical loss is maintained, even for ±1 μm misalignment in standard AIM photonics layer configurations. More specifically, the graph in FIG. 2B presents simulation results for coupling and misalignment tolerances between the optical interposer and a silicon photonic die with negative tapers. This graph indicates a +/−1 μm lateral misalignment tolerance.

Figure 3A:
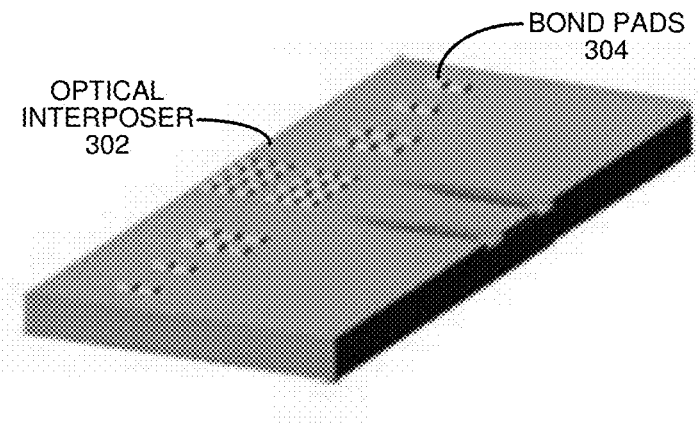
FIG. 3A illustrates an optical interposer with bond pads in accordance with the disclosed embodiments.
Figure 3B:
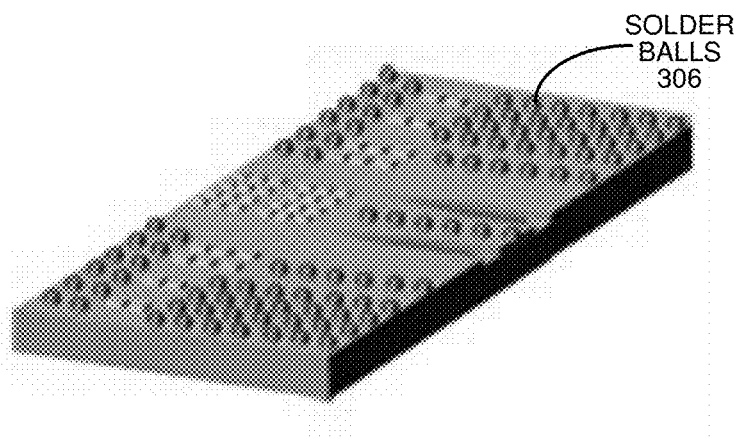
FIG. 3B illustrates an optical interposer with solder balls in accordance with the disclosed embodiments.
Figure 3C:
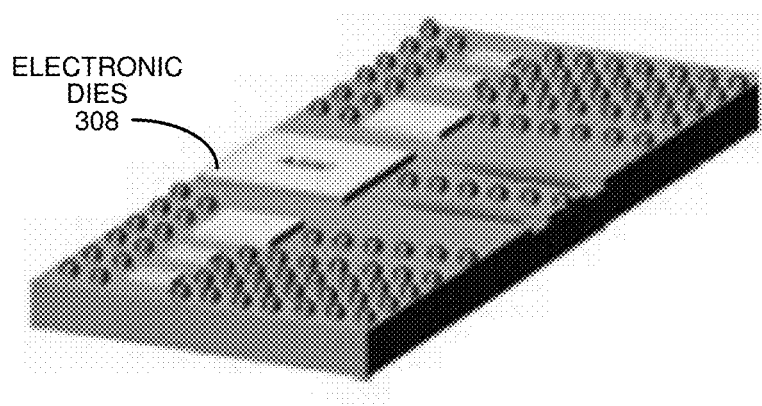
FIG. 3C illustrates an optical interposer with flip-chip bonded electronic dies in accordance with the disclosed embodiments.

FIGS. 3A-3F illustrate a process flow for an integration of an optical interposer 302 with electronic dies 308 and an OE-PCB 310. FIG. 3A illustrates a first step, wherein bond pads 304 are integrated onto optical interposer 302. FIG. 3B illustrates a second step, wherein solder balls 306 are integrated onto optical interposer 302. Note that bond pads 304 and solder balls 306 are both types of "surface-connection elements" that can be integrated onto optical interposer 302. In general, the set of possible surface-connection elements can include: C4 solder bumps; microbumps; copper pillars; bond pads; and metal diffusion bonding elements. FIG. 3C illustrates a third step, which involves flip-chip bonding electronic dies 308 onto the bond pads 304.

Figure 3D:
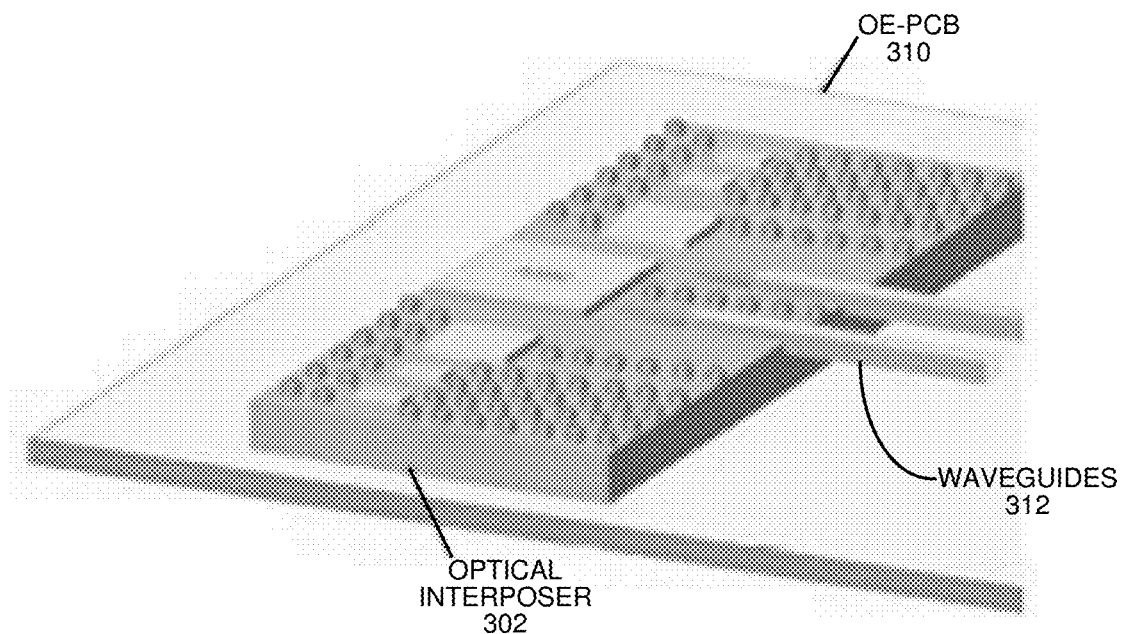
FIG. 3D illustrates a top view of an optical interposer integrated with an OE-PCB in accordance with the disclosed embodiments.
Figure 3E:
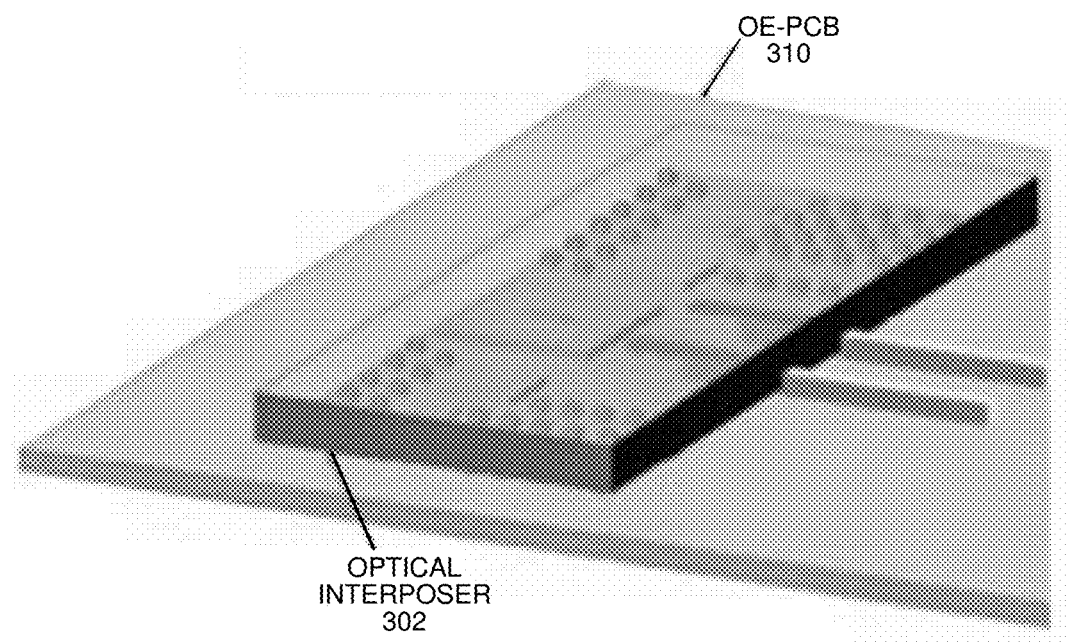
FIG. 3E illustrates a bottom view of an optical interposer integrated with an OE-PCB in accordance with the disclosed embodiments.

Next, the OE-PCB is integrated onto the surface of the optical interposer. In some embodiments, this integration process involves using triangular and/or trapezoidal shapes for mechanical alignment structures in the optical interposer and the OE-PCB to facilitate gross alignment during an initial pick-and-place assembly operation between the optical interposer 302 and the OE-PCB 310. Next, the process uses solder balls 306 to pull the optical interposer into submicron alignment through solder reflow tension to align an optical connection between the optical interposer 302 and the OE-PCB 310. FIG. 3D illustrates a top view of the resulting integration, and FIG. 3E illustrates a bottom view of the integration.

Figure 3F:
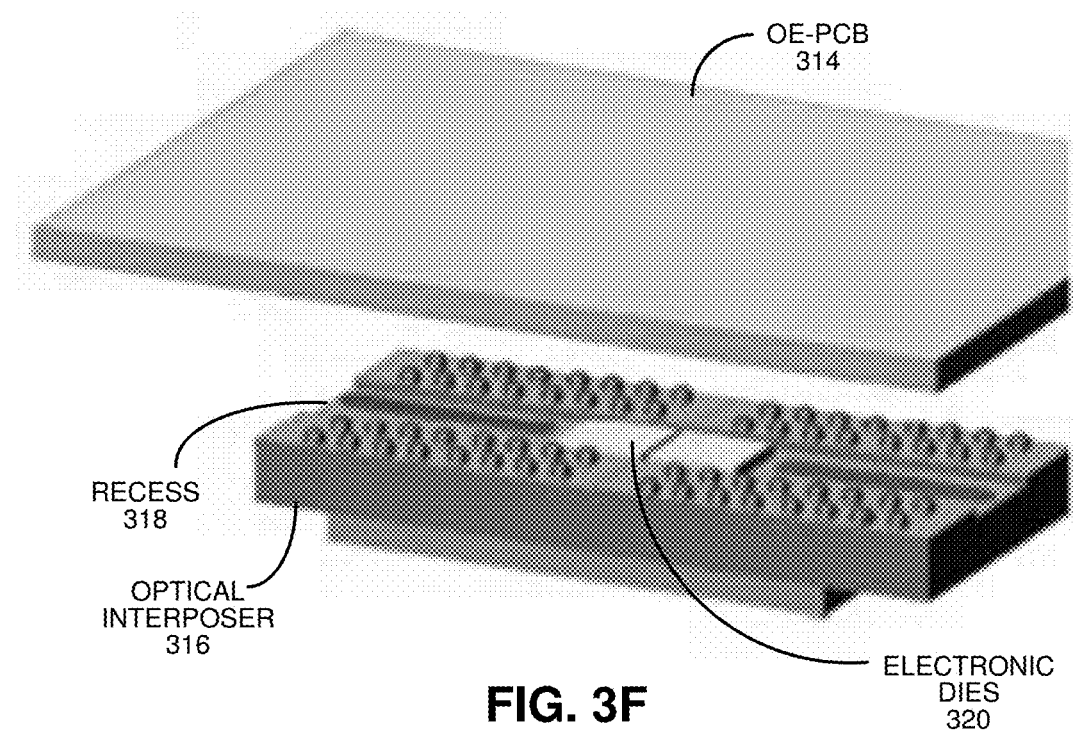
FIG. 3F provides another example, which illustrates a recess in the optical interposer to accommodate the electronic dies, in accordance with the disclosed embodiments.

FIG. 3F illustrates another embodiment, which shows how electronic dies 320 can be bonded within a recess 318 in an optical interposer 316. Optical interposer 316 is subsequently integrated with OE-PCB 314.

Optical Interface

Figure 4A:
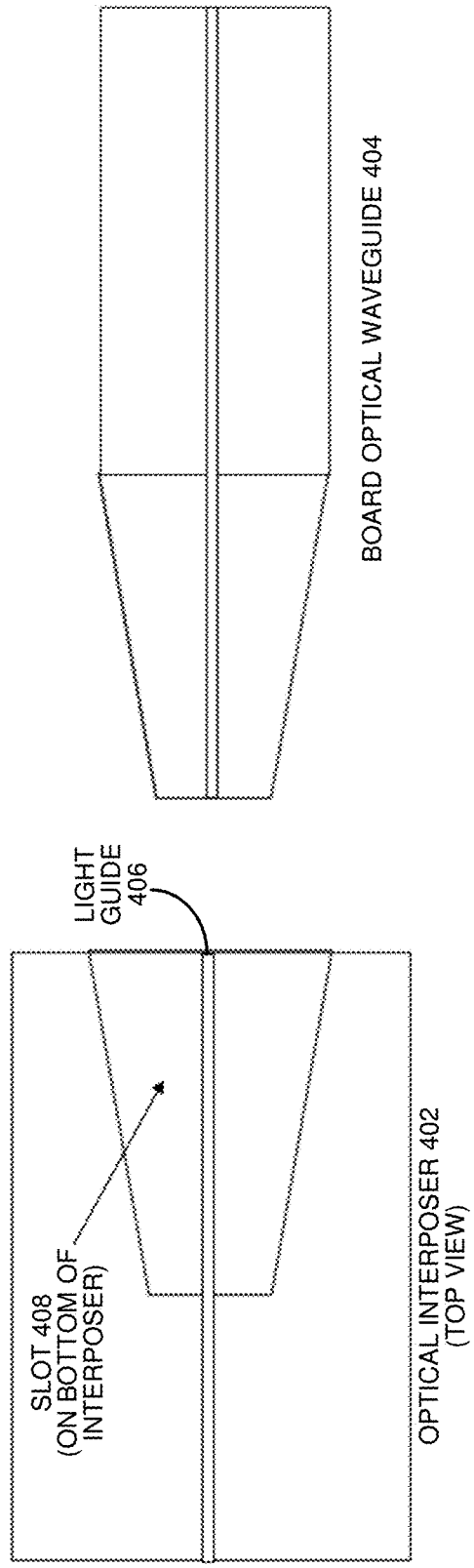
FIG. 4A illustrates how an optical waveguide on an OE-PCB interfaces with an optical interposer in accordance with the disclosed embodiments.

FIG. 4A illustrates additional details about an optical interface between an optical waveguide on an OE-PCB 410 and an optical interposer 402 in accordance with the disclosed embodiments. FIG. 4A provides a top view of optical interposer 402, which includes a light guide 406, as well as a trapezoidal slot 408, which is located on the bottom of interposer 402. Board optical waveguide 404, which is located on OE-PCB 410 illustrated in FIG. 4B, has a compatible trapezoidal shape.

Figure 4B:
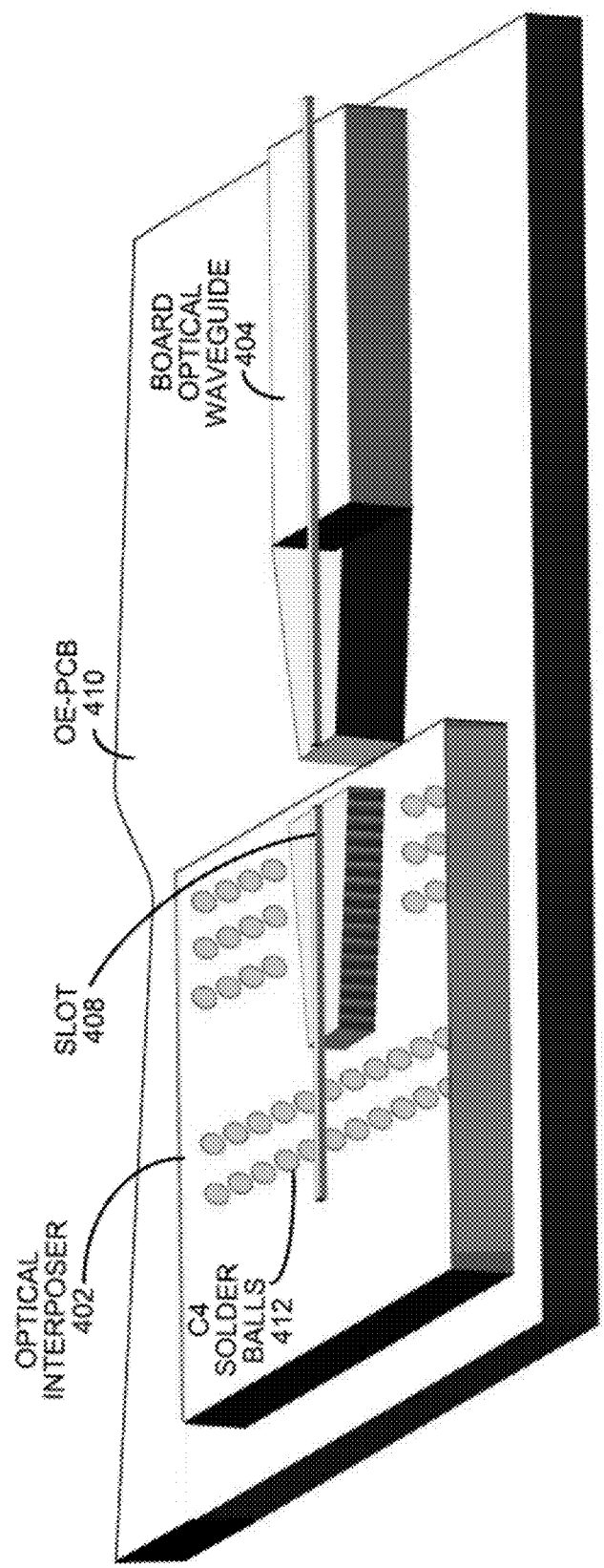
FIG. 4B presents a perspective view illustrating how an optical waveguide on an OE-PCB interfaces with an optical interposer in accordance with the disclosed embodiments.

FIG. 4B provides a perspective view of the same interface. This view illustrates how the board optical waveguide 404, which has a trapezoidal shape, is located on an OE-PCB 410. Optical interposer 402 has a corresponding trapezoidal slot, which is configured to accommodate the trapezoidal shape of board optical waveguide 404 to facilitate a relatively coarse alignment between board optical waveguide 404 and optical interposer 402. FIG. 4B also illustrates C4 solder balls 412, which are used to pull the optical interposer 402 into submicron alignment through solder reflow tension to provide a fine alignment for the optical connection between optical interposer 402 and OE-PCB 410.

Integration Process

Figure 5:
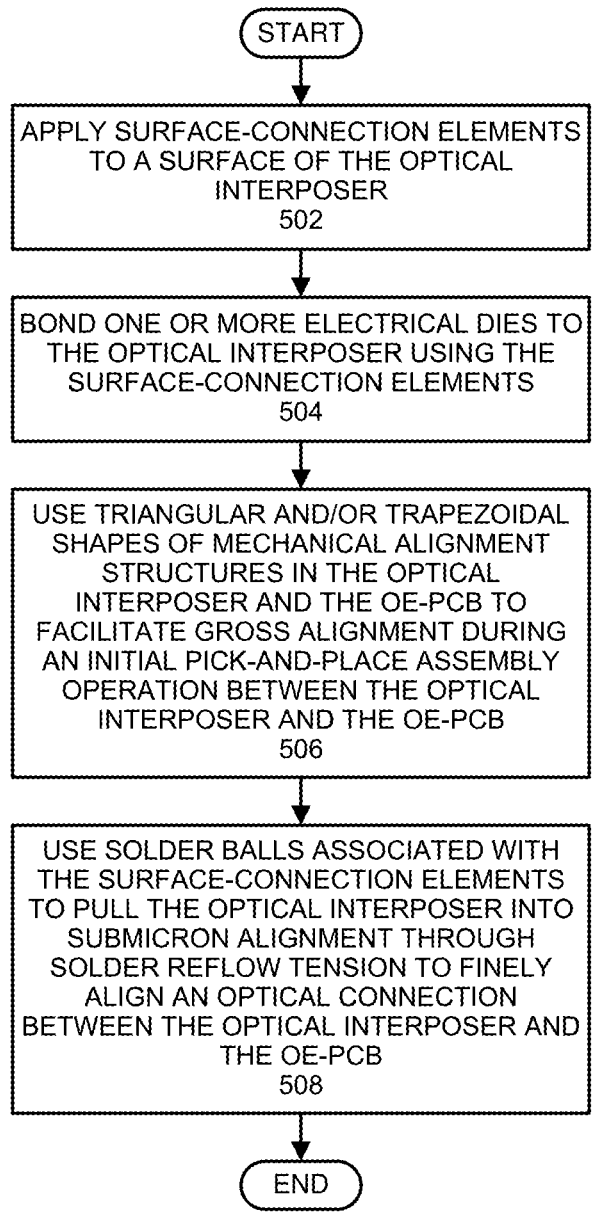
FIG. 5 presents a flow chart illustrating a process for integrating an optical interposer with one or more electronic dies and an OE-PCB in accordance with the disclosed embodiments.

FIG. 5 presents a flow chart illustrating a process for integrating an optical interposer with one or more electronic dies and an OE-PCB in accordance with the disclosed embodiments. This process involves first applying surface-connection elements to a surface of the optical interposer (step 502), and then bonding the one or more electrical dies to the optical interposer using the surface-connection elements (step 504). Next, the method integrates the OE-PCB onto the surface of the optical interposer. This involves using triangular and/or trapezoidal shapes of mechanical alignment structures in the optical interposer and the OE-PCB to facilitate gross alignment during an initial pick-and-place assembly operation between the optical interposer and the OE-PCB (step 506). Next, the process uses solder balls associated with the surface-connection elements to pull the optical interposer into submicron alignment through solder reflow tension to finely align an optical connection between the optical interposer and the OE-PCB (step 508).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for integrating an optical interposer with one or more electronic dies and an optical-electronic (OE) printed circuit board (PCB), comprising:
    applying a first set of surface-connection elements to a surface of the optical interposer;
    bonding the one or more electrical dies to the optical interposer using the first set of surface-connection elements; and
    integrating the OE-PCB onto the surface of the optical interposer, wherein the integration causes the first set of surface-connection elements to provide electrical connections between the optical interposer and the OE-PCB;
    wherein:
        the optical interposer includes a mechanical alignment structure to facilitate optical waveguide alignment and physical interconnection between the optical interposer and the OE-PCB; and a second set of surface-connection elements affixed to the optical interposer further facilitate alignment with additional surface-connection elements located on the OE-PCB.

2. The method of claim 1, wherein the surface-connection elements can include one or more of the following:
   C4 solder bumps;
   microbumps;
   copper pillars;
   bond pads; and
   metal diffusion bonding elements.

3. The method of claim 1, wherein bonding the one or more electrical dies to the optical interposer involves using one or more of the following bonding techniques:
   flip-chip bonding;
   hybrid oxide bonding; and
   hybrid polymer bonding.

4. The method of claim 1,
   wherein the optical interposer includes one or more recesses to provide room for the one or more electronic dies; and
   wherein the one or more electronic dies are bonded within the one or more recesses.

5. The method of claim 1, wherein:
   the mechanical alignment structure comprises one or more grooves; and
   the one or more grooves and one or more corresponding OE-PCB connectors are physically optimized to facilitate lateral alignment when solder reflow tension is applied to the optical interposer.

6. The method of claim 5, wherein light communication energy is transmitted through surface coupling between the one or more grooves of the optical interposer and the one or more OE-PCB connectors.

7. The method of claim 1, wherein the mechanical alignment structure in the optical interposer and a corresponding structure of the OE-PCB are triangular and/or trapezoidal in shape.

8. The method of claim 7, wherein:
   the triangular and/or trapezoidal shapes of the mechanical alignment structure facilitates gross alignment during an initial pick-and-place assembly operation between the optical interposer and the OE-PCB; and
   the second set of surface-connection elements pulls the optical interposer into submicron alignment through solder reflow tension to finely align an optical connection between the optical interposer and the OE-PCB.

9. The method of claim 1, wherein the optical interposer comprises a silicon-photonic optical interposer.

10. A system, which includes an integrated assembly comprising an optical interposer, one or more electronic dies and an optical-electronic (OE) printed circuit board (PCB), wherein the assembly is produced by:
    applying a first set of surface-connection elements to a surface of the optical interposer;
    bonding the one or more electrical dies to the optical interposer using the first set of surface-connection elements; and
    integrating the OE-PCB onto the surface of the optical interposer, wherein the integration causes the first set of surface-connection elements to provide electrical connections between the optical interposer and the OE-PCB;
    wherein:
    the optical interposer includes a mechanical alignment structure to facilitate optical waveguide alignment and physical interconnection between the optical interposer and the OE-PCB; and
    a second set of surface-connection elements affixed to the optical interposer further facilitate alignment with additional surface-connection elements located on the OE-PCB.

11. The system of claim 10, wherein the surface-connection elements can include one or more of the following:
    C4 solder bumps;
    microbumps;
    copper pillars;
    bond pads; and
    metal diffusion bonding elements.

12. The system of claim 10, wherein bonding the one or more electrical dies to the optical interposer involves using one or more of the following bonding techniques:
    flip-chip bonding;
    hybrid oxide bonding; and
    hybrid polymer bonding.

13. The system of claim 10,
    wherein the optical interposer includes one or more recesses to provide room for the one or more electronic dies; and
    wherein the one or more electronic dies are bonded within the one or more recesses.

14. The system of claim 10, wherein:
    the mechanical alignment structure comprises one or more grooves; and
    the one or more grooves and one or more corresponding OE-PCB connectors are physically optimized to facilitate lateral alignment when solder reflow tension is applied to the optical interposer.

15. The system of claim 14, wherein light communication energy is transmitted through surface coupling between the one or more grooves of the optical interposer and the one or more OE-PCB connectors.

16. The system of claim 10, wherein the mechanical alignment structure in the optical interposer and a corresponding structure of the OE-PCB are triangular and/or trapezoidal in shape.

17. The system of claim 16, wherein:
    the triangular and/or trapezoidal shapes of the mechanical alignment structure facilitates gross alignment during an initial pick-and-place assembly operation between the optical interposer and the OE-PCB; and
    the second set of surface-connection elements pulls the optical interposer into submicron alignment through solder reflow tension to finely align an optical connection between the optical interposer and the OE-PCB.

18. The system of claim 10, wherein the optical interposer comprises a silicon-photonic optical interposer.

19. A computer system, comprising:
    a processor comprising a processor chip;
    a memory comprising one or more memory chips; and
    an integrated assembly comprising:
    one or more electronic dies, including the processor chip and the one or more memory chips;
    an optical-electronic (OE) printed circuit board (PCB); and
    an optical interposer comprising:
    a first set of surface-connection elements;
    a mechanical alignment structure to facilitate optical waveguide alignment and physical interconnection between the optical interposer and the OE-PCB; and a second set of surface-connection elements that further facilitate alignment with additional surface-connection elements located on the OE-PCB;
wherein the assembly is produced by:
applying the first set of surface-connection elements to a surface of the optical interposer;
bonding the one or more electrical dies to the optical interposer using the first set of surface-connection elements; and
integrating the OE-PCB onto the surface of the optical interposer, wherein the integration causes the first set of surface-connection elements to provide electrical connections between the optical interposer and the OE-PCB.

20. An integrated assembly with optical and electrical components, comprising:
an optical interposer;
one or more electronic dies, which are flip-chip bonded onto the optical interposer using a first set of surface connection elements; and
an OE-PCB integrated onto a surface of the optical interposer, wherein the integration causes the first set of surface-connection elements to provide electrical connections between the optical interposer and the OE-PCB;
wherein:
the optical interposer includes a mechanical alignment structure to facilitate optical waveguide alignment and physical interconnection between the optical interposer and the OE-PCB; and
a second set of surface-connection elements affixed to the optical interposer further facilitate alignment with additional surface-connection elements located on the OE-PCB.

21. The integrated assembly of claim 20, wherein the surface-connection elements can include one or more of the following:
C4 solder bumps;
microbumps;
copper pillars;
bond pads; and
metal diffusion bonding elements.

22. The integrated assembly of claim 20, wherein the one or more electrical dies were bonded to the optical interposer using one or more of the following bonding techniques:
flip-chip bonding;
hybrid oxide bonding; and
hybrid polymer bonding.

23. The integrated assembly of claim 20,
wherein the optical interposer includes one or more recesses to provide room for the one or more electronic dies; and
wherein the one or more electronic dies are bonded within the one or more recesses.

24. The integrated assembly of claim 20, wherein:
the mechanical alignment structure comprises one or more grooves; and
the one or more grooves and one or more corresponding OE-PCB connectors are physically optimized to facilitate lateral alignment when solder reflow tension is applied to the optical interposer.

25. The integrated assembly of claim 24, wherein light communication energy is transmitted through surface coupling between the one or more grooves of the optical interposer and the one or more OE-PCB connectors.

26. The integrated assembly of claim 20, wherein the mechanical alignment structure in the optical interposer and a corresponding structure of the OE-PCB are triangular and/or trapezoidal in shape.

27. The integrated assembly of claim 26, wherein:
the triangular and/or trapezoidal shapes of the mechanical alignment structure facilitates gross alignment during an initial pick-and-place assembly operation between the optical interposer and the OE-PCB; and
the second set of surface-connection elements pulls the optical interposer into submicron alignment through solder reflow tension to finely align an optical connection between the optical interposer and the OE-PCB.

* * * * *